United States Patent
Schimert et al.

(10) Patent No.: US 7,375,331 B2
(45) Date of Patent: *May 20, 2008

(54) OPTICALLY BLOCKED REFERENCE PIXELS FOR FOCAL PLANE ARRAYS

(75) Inventors: Thomas R. Schimert, Ovilla, TX (US); Athanasios J. Syllaios, Richardson, TX (US); Roland W. Gooch, Dallas, TX (US); William L. McCardel, Plano, TX (US)

(73) Assignee: L-3 Communications Corporation, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/880,554

(22) Filed: Jul. 23, 2007

(65) Prior Publication Data

US 2007/0262407 A1 Nov. 15, 2007

Related U.S. Application Data

(63) Continuation of application No. 11/141,356, filed on May 31, 2005, now Pat. No. 7,262,412.

(60) Provisional application No. 60/635,398, filed on Dec. 10, 2004.

(51) Int. Cl.
  *G01J 5/00* (2006.01)
  *H01L 31/0203* (2006.01)

(52) U.S. Cl. .................. 250/338.1; 257/431; 257/433; 257/435; 257/678; 257/704

(58) Field of Classification Search ............ 250/208.1, 250/208.2, 214 R, 214.1, 239, 214 B, 339.02, 250/338.3, 339.05, 338.1; 257/431–433, 257/435, 294, 678, 704

See application file for complete search history.

(56) References Cited

U.S. PATENT DOCUMENTS

| 4,463,262 | A | 7/1984 | Contreras |
| 6,020,582 | A | 2/2000 | Bawolek et al. |
| 6,064,066 | A | 5/2000 | Bevan et al. |
| 6,094,281 | A | 7/2000 | Nakai et al. |
| 6,521,477 | B1 | 2/2003 | Gooch et al. |
| 6,586,831 | B2 | 7/2003 | Gooch et al. |
| 6,690,014 | B1 | 2/2004 | Gooch et al. |
| 6,777,681 | B1 | 8/2004 | Schimert et al. |
| 2004/0219704 | A1 | 11/2004 | Syllaios et al. |
| 2005/0077458 | A1 | 4/2005 | Ma et al. |
| 2006/0124831 | A1 | 6/2006 | Schimert et al. |

FOREIGN PATENT DOCUMENTS

WO WO02/088648 A1 11/2002

OTHER PUBLICATIONS

Search Report, PCT/US05/43559; Aug. 29, 2005; 4 pgs.

*Primary Examiner*—Davienne Monbleau
(74) *Attorney, Agent, or Firm*—O'Keefe, Egan, Peterman & Enders LLP

(57) ABSTRACT

Methods for making optically blind reference pixels and systems employing the same. The reference pixels may be configured to be identical to, or substantially identical to, the active detector elements of a focal plane array assembly. The reference pixels may be configured to use the same relatively longer thermal isolation legs as the active detector pixels of the focal plane, thus eliminating joule heating differences. An optically blocking structure may be placed in close proximity directly over the reference pixels.

32 Claims, 6 Drawing Sheets

_US 7,375,331 B2_

OPTICALLY BLOCKED REFERENCE PIXELS FOR FOCAL PLANE ARRAYS

This application is a continuation application of U.S. patent application Ser. No. 11/141,356 filed May 31, 2005 now U.S. Pat. No. 7,262,412, and entitled "OPTICALLY BLOCKED REFERENCE PIXELS FOR FOCAL PLANE ARRAYS", which itself claims priority to U.S. Provisional patent application Ser. No. 60/635,398, filed Dec. 10, 2004, and entitled "OPTICALLY BLOCKED REFERENCE PIXELS FOR FOCAL PLANE ARRAYS" by Schimert et al., the entire disclosure of each of the foregoing references being incorporated herein by reference.

BACKGROUND OF THE INVENTION

1. Field of the Invention

This invention relates generally to focal plane arrays, and more particularly to reference pixels for focal plane arrays 2. Description of the Related Art Microelectromechanical systems (MEMS) are integrated micro devices or systems combining electrical and mechanical components. Some MEMS devices may be fabricated using standard integrated circuit batch processing techniques and have a variety of applications including sensing controlling and actuating on a micro scale. MEMS devices may function individually or in arrays to generate effects on a macro scale.

Certain MEMS devices require a vacuum environment in order to obtain maximum performance. The vacuum package also provides protection in an optimal operating environment for the MEMS device. Examples of these MEMS devices are infrared MEMS such as bolometers. In addition to the necessity of a vacuum or otherwise controlled environment for an infrared bolometer, infrared MEMS devices require an infrared-transparent cover, or lid structure. These lids are often coated with an anti-reflective coating to reduce the reflective properties and increase the infrared transmission properties of the lid.

Over the years, various types of infrared detectors have been developed. Many include a substrate having thereon a focal plane array, the focal plane array including a plurality of detector elements that each correspond to a respective pixel. The substrate contains an integrated circuit which is electrically coupled to the detector elements, and which is commonly known as a read out integrated circuit (ROIC) and which is used to integrate the signal from each detector element and multiplex the signals off the chip with appropriate signal conditioning and processing.

Each detector element includes a membrane which is suspended at a location spaced above the top surface of the substrate, in order to facilitate thermal isolation. The membrane includes a thermally sensitive material, such as amorphous silicon (a-Si) or vanadium oxide (VOx). The membrane also includes two electrodes, which are each coupled to the thermally sensitive material, and which are also coupled to the ROIC in the substrate. As the temperature of the thermally sensitive material varies, the resistance of the thermally sensitive material also varies, and the ROIC in the substrate can determine the amount of thermal energy which has been received at a detector element by sensing the corresponding resistance change of that detector element.

Uncooled infrared focal plane arrays operating at ambient temperature and without the use of active temperature stabilization require infrared optically blind reference pixels that do not absorb incident infrared radiation. These infrared optically blind reference pixels are used to determine ambient temperature of the focal plane which is required in the calibration of the focal plane array over the operating temperature of the focal plane array. This involves implementation of a gain and offset correction algorithm at any given temperature (sensed by the reference pixels) to the active detector elements in order to correct the image for ambient temperature drift effects, e.g., in an imaging focal plane array.

In the past, reference pixels have been made infrared optically blind by using short thermal isolation legs for the suspended infrared absorbing element in combination with placement of an infrared reflecting aluminum metallization directly on the reference pixel. However, reference pixels fabricated in this way have less Joule heating (e.g., in a voltage-biased suspended microbolometer structure) due to the shorter legs and to a lesser extent the added thermal mass of the aluminum reflector. As such, the output of the reference pixel as read out using a ROIC tends to diverge from the output of the infrared responsive suspended pixel detector elements, thereby limiting dynamic range both in terms of scene temperature and ambient temperature operating ranges.

SUMMARY OF THE INVENTION

Disclosed herein are methods for making optically blind reference pixels and systems employing the same, such as focal plane array assemblies that include optically non-responsive reference pixels in the form of optically blind reference pixels. The disclosed systems and methods may be advantageously implemented with any type of imaging device assembly or device that senses temperature, and that utilizes optically blind reference pixels, e.g., infrared imaging devices, millimeter wave image devices, sub-millimeter wave imaging devices, etc.

In one embodiment disclosed herein, reference pixels may be configured to be identical to, or substantially identical to, the active detector elements of a focal plane array assembly to minimize divergence in the output of the reference and active pixel elements over temperature, thus increasing scene temperature and ambient temperature dynamic ranges. In another embodiment, the reference pixels may be configured to use the same relatively longer thermal isolation legs as the active detector pixels of the focal plane, thus substantially eliminating joule heating differences. In another embodiment, the conventional reflective aluminum layer on the reference pixel (that causes thermal mass and stress differences relative to the active detector pixels) may be eliminated and replaced by an optically blocking structure (e.g., optically blocking substantially reflective metallization layer) placed in close proximity directly over the reference pixels.

In one embodiment, the disclosed methods and systems may be advantageously configured for use with cooled and uncooled infrared camera products and more particularly in the manufacture of sensors and focal plane arrays, e.g., uncooled or cooled long wavelength (about 7-14 um) infrared (LWIR) arrays; uncooled or cooled mid wavelength (about 3-5 um) infrared (MWIR) arrays; multi-color (e.g., LWIR and MWIR) uncooled or cooled infrared bolometer or diode detector arrays; or uncooled or cooled avalanche photodiode (APD) arrays.

In one respect, disclosed herein is a focal plane array package assembly, including: at least one active detector pixel element; at least one reference pixel element; an optically blocking structure disposed in spaced relationship with the at least one reference pixel element to at least partially optically block the reference pixel; and a package assembly lid overlying the at least one active detector pixel element and the at least one reference pixel element; the package assembly lid including the optically blocking structure.

In another respect, disclosed herein is a focal plane array assembly, including: a device wafer die element, the device wafer die element including at least one active detector pixel element array and at least one reference pixel array disposed on a first surface thereof, and a lid wafer element, the lid wafer element having a first surface disposed in relationship to the first surface of the device wafer die element so that the first surface of the lid wafer element overlies the at least one active detector pixel element array and the at least one reference pixel element array. The lid wafer element may be configured to optically block the at least one reference pixel element.

In another respect, disclosed herein is a method of making a focal plane array assembly, comprising: providing at least one active detector pixel and at least one reference pixel on a first surface of a device wafer; and disposing a lid wafer in relationship to said device wafer, said lid wafer comprising an optically blocking structure disposed in a spaced relationship to said at least one reference pixel of said device wafer.

DESCRIPTION OF ILLUSTRATIVE EMBODIMENTS

Figure 1:
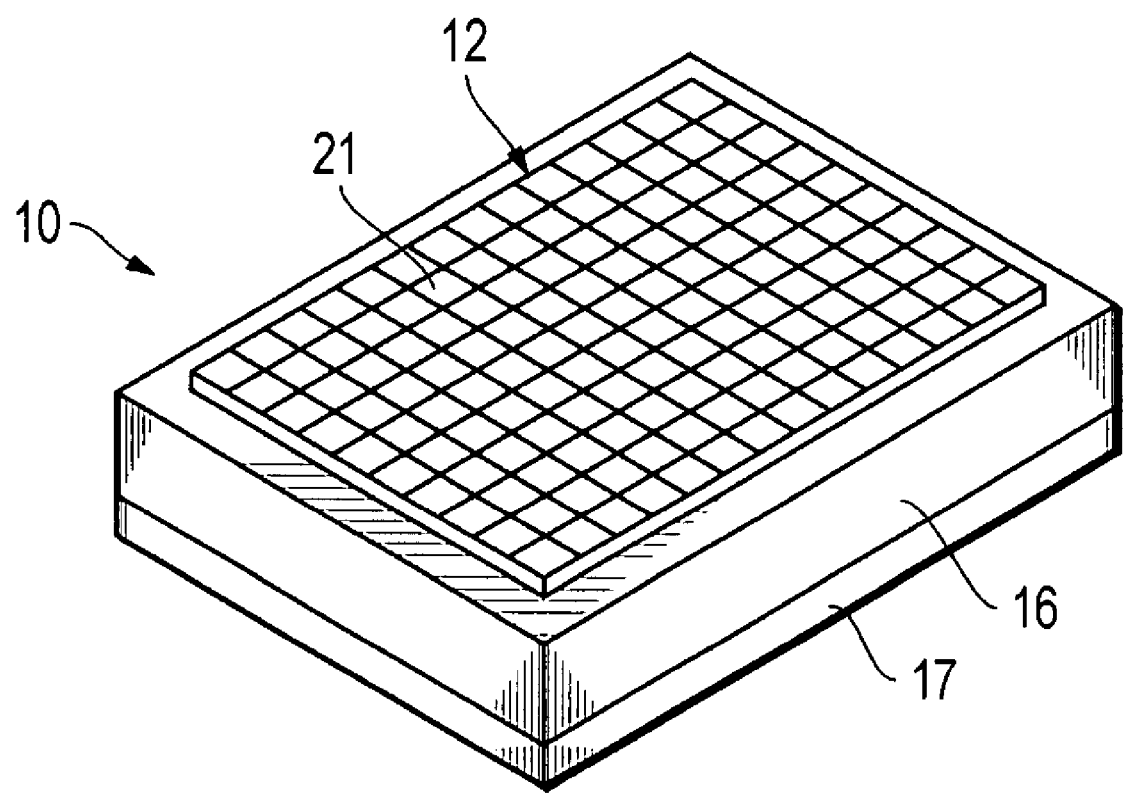
FIG. 1 is a perspective view of an infrared detector according to one embodiment of the disclosed systems and methods.

FIG. 1 is a diagrammatic perspective view of an infrared detector 10 which may be used according to one embodiment of the disclosed systems and methods to sense thermal energy and output electrical signals representative of a two-dimensional image of that sensed thermal energy. In this embodiment, the infrared detector 10 includes a focal plane array (FPA) 12 disposed on a substrate 16. The substrate 16 includes an integrated circuit of a type which is commonly known as a read out integrated circuit (ROIC). The ROIC integrates the thermally induced electrical signals from each detector element 21 in the focal plane array 12 and multiplexes the signals off the array with the appropriate signal conditioning and processing.

As shown in FIG. 1, an optional thermal element 17 (e.g., active heat sink) may be provided on the side of the substrate 16 opposite from the focal plane array 12, in order to serve as a form of controlled heat sink which may be used, for example, to maintain the operating temperature of integrated circuit substrate 16 within a temperature range which may be predefined. However, it will be understood that thermal element 17 does not have to be present, and that no form of temperature stabilization is required in the practice of the disclosed systems and methods.

Figure 2:
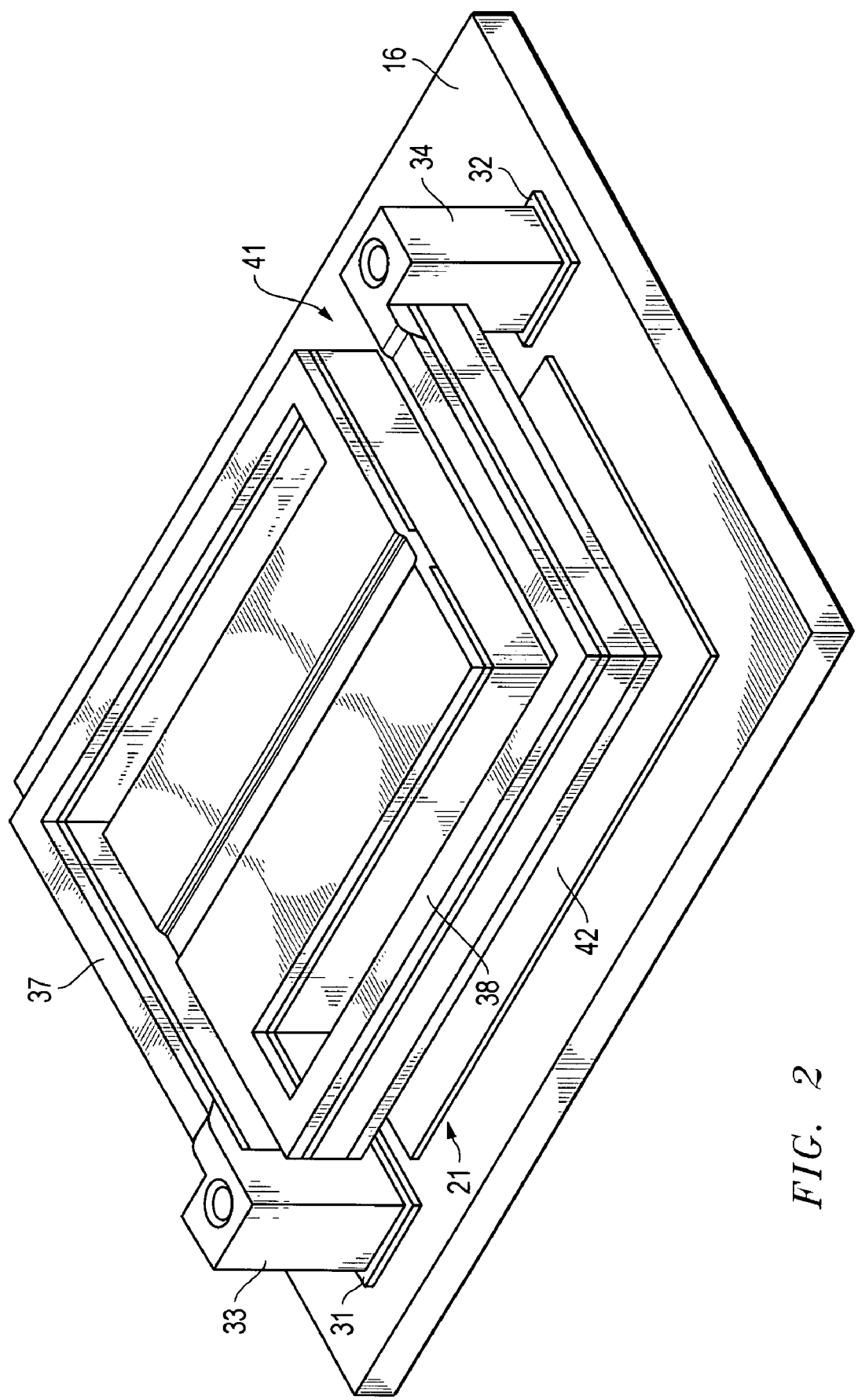
FIG. 2 is a partial perspective view of a detector element according to one embodiment of the disclosed systems and methods.

In the embodiment of FIG. 1, the focal plane 12 includes a plurality of thermal sensors or detector elements, one of which is designated by reference numeral 21. The detector elements are arranged in a two-dimensional array, and each detector element 21 corresponds to a respective pixel in each image detected by the infrared detector 10. The focal plane array 12 of the disclosed embodiment includes 76,800 detector elements 21, which are arranged in a 320 by 240 array, although a focal plane array may be of any other size depending as needed or desired for a particular application, e.g., ranging in size from greater than or equal to an 80×60 array up to megapixel-sized arrays. For clarity, however, FIG. 1 diagrammatically depicts only about 140 detector elements. It will be recognized that the total number of detector elements 21 in the focal plane array 12 may be larger or smaller. Further, even though FIG. 1 shows the detector elements 21 arranged in a two-dimensional array, they may alternatively be arranged in a one-dimensional array, or may be provided at arbitrary locations that do not conform to a specific pattern. With reference to FIG. 2, one of the detector elements 21 of FIG. 1 will be described in more detail.

More specifically, FIG. 2 is a diagrammatic fragmentary perspective view of a portion of the integrated circuit substrate 16, which has one of the detector elements 21 on it. It will be understood that the embodiment of FIG. 2 is exemplary only, and that detector elements may be configured in any other suitable manner. In one embodiment, all of the detector elements may have the same structural configuration. As shown, the substrate 16 has on an upper surface thereof two spaced electrical contacts or pads 31 and 32, which are each electrically coupled in a not-illustrated manner to an ROIC that is implemented within the substrate 16. Two electrically conductive interconnects 33 and 34 are each electrically coupled to and extend upwardly from a respective one of the contacts 31 and 32. Interconnects 33 and 34 may be of any suitable composition (e.g., metal interconnects). In one embodiment interconnects 33 and 34 may be aluminum. In an alternative embodiment, interconnects 33 and 34 may be titanium tungsten (TiW). Two approximately L-shaped thermal isolation legs 37 and 38 each have one end supported on a respective one of the interconnects 33 and 34. The opposite ends of the legs 37 and 38 support a multi-layered membrane 41.

Still referring to FIG. 2, the top surface of the substrate 16 may optionally have thereon a layer 42 of a material which reflects infrared radiation. A space or gap exists between the membrane 41 and the reflective layer 42, and the distance between them is selected to be approximately one-quarter of a wavelength of the infrared radiation of interest, so as to create a resonant cavity which effectively traps the radiation of interest until it can be absorbed by the membrane, in order to increase the amount of the received infrared radiation which is absorbed by the membrane 41. Although the distance between the membrane 41 and the reflective layer 42 is about one-quarter wavelength, it may alternatively be some other appropriate distance, such as about equal to an odd multiple of one-quarter of a wavelength. Further information on examples of infrared detectors and focal plane array configurations that may be employed in the practice of the disclosed systems and methods may be found in U.S. Pat. Nos. 6,777,681 and 6,690,014, each of which is incorporated herein by reference.

Figure 3A:
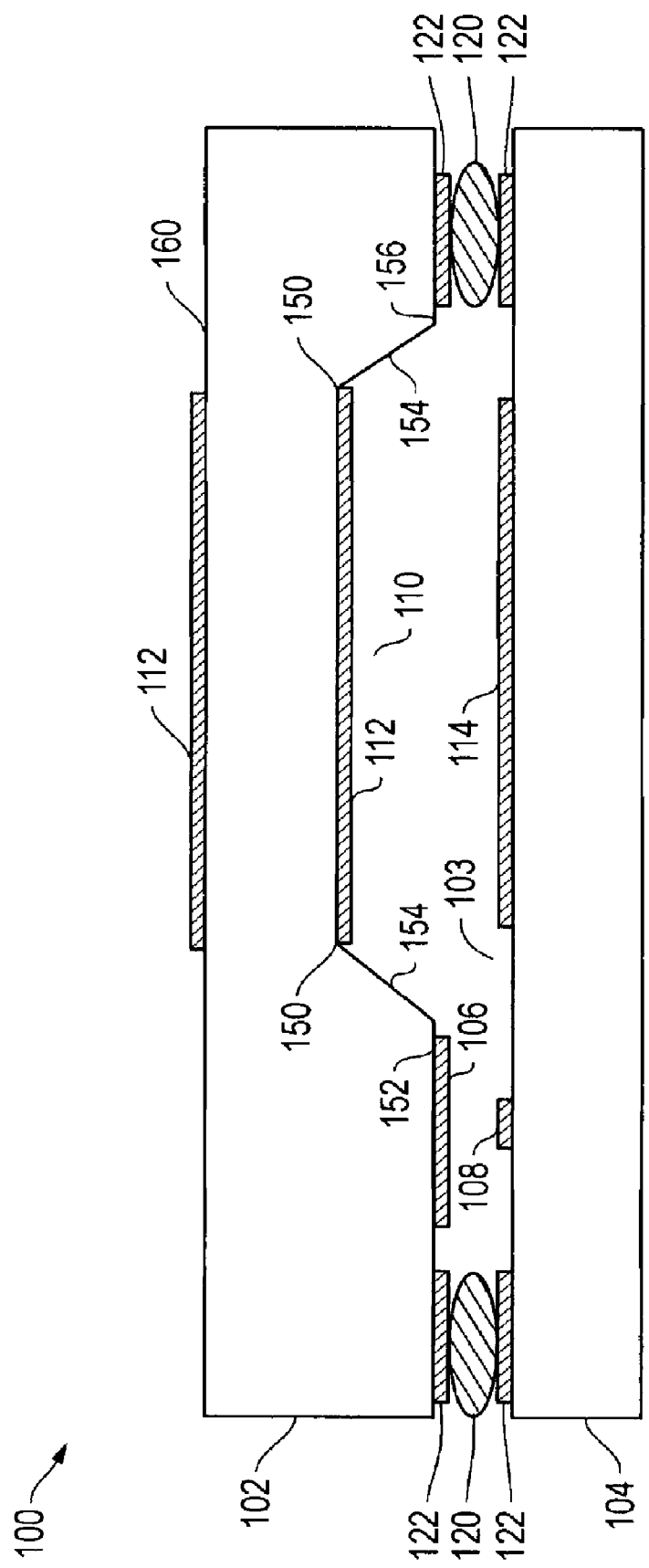
FIG. 3A is a simplified side cross-sectional view of a vacuum packaged focal plane array (FPA) assembly according to one embodiment of the disclosed systems and methods.

FIG. 3A illustrates a cross sectional view of one exemplary embodiment of a vacuum packaged uncooled M×N focal plane array (FPA) assembly 100 in a solder-sealed wafer-level vacuum packaged configuration including transparent lid wafer element 102 and ROIC device wafer die element 104 having a vacuum space 103 formed therebetween. In this embodiment, vacuum packaged FPA assembly 100 represents a single die package assembly (i.e., FPA die assembly sawn or otherwise segmented from the wafer-bonded device and lid wafer pair after performance of a lid wafer-to-device wafer bonding process), although it will be understood that vacuum packaged FPA assembly 100 may be a single die FPA assembly that is assembled in any other suitable alternative manner. In this embodiment, transparent lid wafer element 102 performs the function of a vacuum package lid that is sealed to wafer die element 104 to form sealed vacuum space 103 therebetween.

Still referring to FIG. 3A, device wafer die element 104 may be a silicon device wafer die such as a standard substrate used for fabrication of integrated circuit devices, microelectromechanical systems (MEMS) devices or similar devices, e.g., a substrate material with or without integrated circuit readout devices embedded therein. Similarly, a transparent silicon wafer may be employed for the lid wafer element 102, although any other suitable infrared transparent lid wafer material (e.g., such as germanium, zinc selenide, or zinc sulfide, etc.) may alternatively be used.

As shown in FIG. 3A, ROIC device wafer die element 104 includes active pixel focal plane array 114 disposed on the substrate of wafer 104, e.g., corresponding to focal plane array 12 disposed on substrate 16 of FIG. 1. Assembly 100 also includes an infrared optically blocked reference pixel array 108 (i.e., array 108 of P×Q reference pixel elements) that is disposed on the substrate of wafer 104 as shown. As shown, vacuum space 103 covers active pixel focal plane array 114 and optically blocked reference pixel array 108. In the practice of the disclosed systems and methods, a vacuum packaged assembly such as assembly 100 may be fabricated, for example, using techniques such as described in U.S. Pat. Nos. 6,586,831 and 6,521,477, and in U.S. patent application Ser. No. 11/141,361, entitled "SYSTEMS AND METHODS FOR SOLDER BONDING" by Syllaios, et al. that is concurrently filed herewith, all three of which references are incorporated herein by reference.

In one exemplary embodiment of the disclosed methods and systems, the active infrared detector pixels of focal plane array 114 may be low thermal mass amorphous silicon (a-Si) microbolometer infrared absorbing detector pixel elements suspended and thermally isolated from the ROIC die element 104 by relatively long thermal isolation legs (e.g., thermal isolation leg length being equal to one or more side lengths of an active pixel, such as a leg length of from about 25 to about 50 microns in the case of 25 micron×25 micron square active pixels). However, other thermal isolation leg lengths are possible, e.g., a thermal isolation leg length that is equal to from about 15 to about 50 microns in the case of 25 micron×25 micron square active pixels, a thermal isolation leg length that is greater than about 50 microns, a thermal isolation leg length that is less than about 15 microns, etc.

In this exemplary embodiment, the suspended microbolometer may be configured as a silicon nitride/amorphous silicon/silicon nitride (SiN/a-Si/SiN) membrane structure in which a thin infrared absorbing metal layer, titanium (Ti) or titanium aluminum (TiAl), is embedded between SiN layers. A reflective metal layer may be placed on the surface of the ROIC die element 104 under the suspended membrane structure to construct a quarterwave resonant cavity structure to enhance infrared absorption in the low thermal mass membrane structure. However, it will be understood that active infrared detector pixels of focal plane array 114 may include any other type of pixel elements or combination of pixel elements suitable for infrared detection including, but not limited to, vanadium oxide, thin film ferroelectric or pyroelectric, silicon germanium and silicon germanium oxide, etc.

As previously described, the infrared optically blocked pixels of reference pixel array 108 may be made identical or substantially identical in configuration to the active infrared detector pixels of focal plane array 114. In this regard, infrared optically blocked pixels may be made as nearly identical to the active detector pixels as desired. For example, in one embodiment the reference pixels may be suspended thermally isolated reference pixel elements configured identical to the active detector pixels, employing the quarterwave resonant cavity structure with aluminum reflector in substrate and the thin infrared absorbing metal layer embedded between SiN layers in the suspended membrane. In an alternative embodiment, the aluminum reflector on the substrate may be eliminated to remove the quarterwave resonant cavity structure. In yet another alternative embodiment, the thin infrared absorbing metal layer embedded between SiN Layers may be eliminated. Furthermore, if desired the reference pixels may be configured to use thermal isolation legs having substantially the same length as the active detector pixels of focal plane array 114, e.g., in one embodiment the same relatively longer thermal isolation legs having a length equal to one or more side lengths of an active pixel, may be used for both reference pixels of reference array 108 and active detector pixels of the focal plane array 114, thus eliminating joule heating differences.

In the exemplary embodiment of FIG. 3A, an optically blocking structure in the form of a blocking layer 106 is shown fabricated on the inner surface of the lid wafer element 102 directly over the reference row 108. A blocking layer may be so configured and positioned to at least partially or completely block infrared radiation from reaching reference pixel array 108. In this embodiment, the blocking layer 106 is placed in spaced relationship (e.g., spaced adjacent relationship) and in close proximity (e.g., at a distance of from about 10 to about 15 microns, alternatively at a distance of from about 10 to about 25 microns) to the reference pixel array 108 to minimize absorption of both on-axis and off-axis infrared radiation, however any other distance may be employed that is suitable for at least partially or completely blocking infrared radiation from reaching reference pixel array 108.

It will also be understood that an infrared optically blocking structure may be any surface or internal structure (e.g., metallic, non-metallic, featured, etc.) suitable for at least partially or completely blocking infrared radiation from reaching a reference pixel array. For example, in one exemplary embodiment optically blocking layer 106 may be a metallic reflective layer, for example, an optical block metallization layer such as gold-platinum-titanium (Au/Pt/Ti), although alternative metallization layers are possible, e.g., gold-palladium-titanium (Au/Pd/Ti), gold-nickel-titanium (Au/Ni/Ti), aluminum, aluminum-titanium (Al/Ti), etc. Examples of non-metallic blocking layer materials include, but are not limited to, infrared absorbing borosilicate glass films, stack layers of antireflection (AR) coating forming materials such as zinc sulfide (ZnS), ytterbium fluoride (YbF$_3$), ZnS/YbF$_3$, ZnS/germanium, zinc selenide (ZnSe)/germanium, etc. deposited on the silicon lid wafer to form IR cutoff filters. Optically blocking layer materials may be applied using any suitable method, e.g., evaporation, sputtering, plating, etc. In the exemplary embodiment of FIG. 3A, optically blocking layer 106 may be of the same material and may be applied at the same time (as part of the same process step) as metallization layer 122, although optically blocking layer 106 may be of any material composition and thickness that reflects or substantially reflects light, or that is otherwise substantially non-optically transmissive.

Furthermore, an infrared optically blocking structure may be configured in relation to a lid wafer element in any position suitable for reducing or substantially blocking infrared radiation from reaching a reference pixel array, e.g., configured in position on inner surface of a lid wafer element, configured in position on outer surface of a lid wafer element, configured in position within a lid wafer element body between inner and outer surfaces of the lid wafer element, combinations thereof, etc. In one exemplary embodiment Still referring to the embodiment of FIG. 3A, a gold-tin (AuSn) solder seal 120 is shown disposed between gold-platinum-titanium metallization layers 122 provided on each of the bond surfaces of lid wafer element 102 and FPA/ROIC device wafer die element 104, i.e., as a peripheral seal around active array 114 and reference array 108. However, any other suitable methodology for forming a vacuum tight peripheral seal around active array 114 and reference array 108 may be employed, e.g., such as lid and device sealing rings and heat activated solder layer and non-heat activated sealing layers described in U.S. Pat. Nos. 6,586,831 and 6,521,477, each of which have been incorporated herein by reference. Furthermore, it will be understood that it is not necessary that a seal (e.g., vacuum tight seal) be employed.

In the illustrated embodiment of FIG. 3A, the silicon lid wafer element 102 employs a cavity 110 (e.g., wet or dry etched cavity in lid wafer element 102) and antireflection surfaces 112 (e.g., antireflection coatings) on inner and outer surfaces 150 and 160 over the active infrared detector pixels of focal plane array 114. Cavity 110 may be present, for example, to provide increased volume and higher vacuum level within the vacuum package assembly. As shown, cavity 110 is disposed above active focal plane array 114, but does not extend over reference pixel array 108. In this regard, cavity 110 is formed by raised inner surface 150 of lid wafer element 102 that extends above active focal plane array 114 (e.g., disposed at a distance of from about 100 microns to about 800 microns from active focal plane array 114), and between angled inner surfaces 154 and 156 of the cavity walls of lid wafer element 102.

Still referring to the exemplary embodiment of FIG. 3A, stepped down inner surface 152 extends above reference pixel array 108 in a manner that supports optically blocking layer 106 in close proximity (e.g., at a distance of from about 10 to about 15 microns, alternatively at a distance of from about 10 to about 25 microns) to the reference pixel array 108, as previously described. Stepped down inner surface 152 in combination with optically blocking layer 106 may be so configured in a manner that acts to substantially block infrared radiation from reaching reference pixel array 108 through lid wafer element 102. However, it will be understood that stepped down inner surface 152 may be alternatively positioned at any other distance from reference pixel array 108 that is suitable for reducing or substantially eliminating transmission of infrared radiation to reference pixel array 108 from cavity 110 under optically blocking layer 106. In this embodiment, angled inner surfaces 154 that form walls of cavity 110 are an artifact of the etching process and are illustrated extending between raised inner surface 150 and stepped down inner surface 152. In this regard, it will be understood that such angled inner surfaces 154 may have a variety of different slopes, or that no angled lid surface need be present, i.e., the inner surface of lid wafer element 102 may be oriented in a direction that is perpendicular to the plane of reference array 108.

Antireflection surfaces 112 may be provided on the outer surface 160 and/or inner surface 150 of lid wafer element 102 as shown, e.g., to reduce the reflective properties and increase the optical transmission properties of the lid wafer element 102. Examples of such surfaces include anti-reflective coatings such as ZnS/YbF$_3$, ZnS/Germanium, ZnSe/Germanium, etc. In another embodiment, an anti-reflective surface may be a structure (e.g., sub-wavelength structure or grating) that is etched on the inner surface 150 and/or outer surface 160 of lid wafer element 102 to increase the optical transmission properties of lid wafer element 102. Examples of such sub-wavelength structures are described in U.S. patent application Ser. No. 10/428,745, Patent Application Publication No. 20040219704, which is incorporated herein by reference.

Figure 3B:
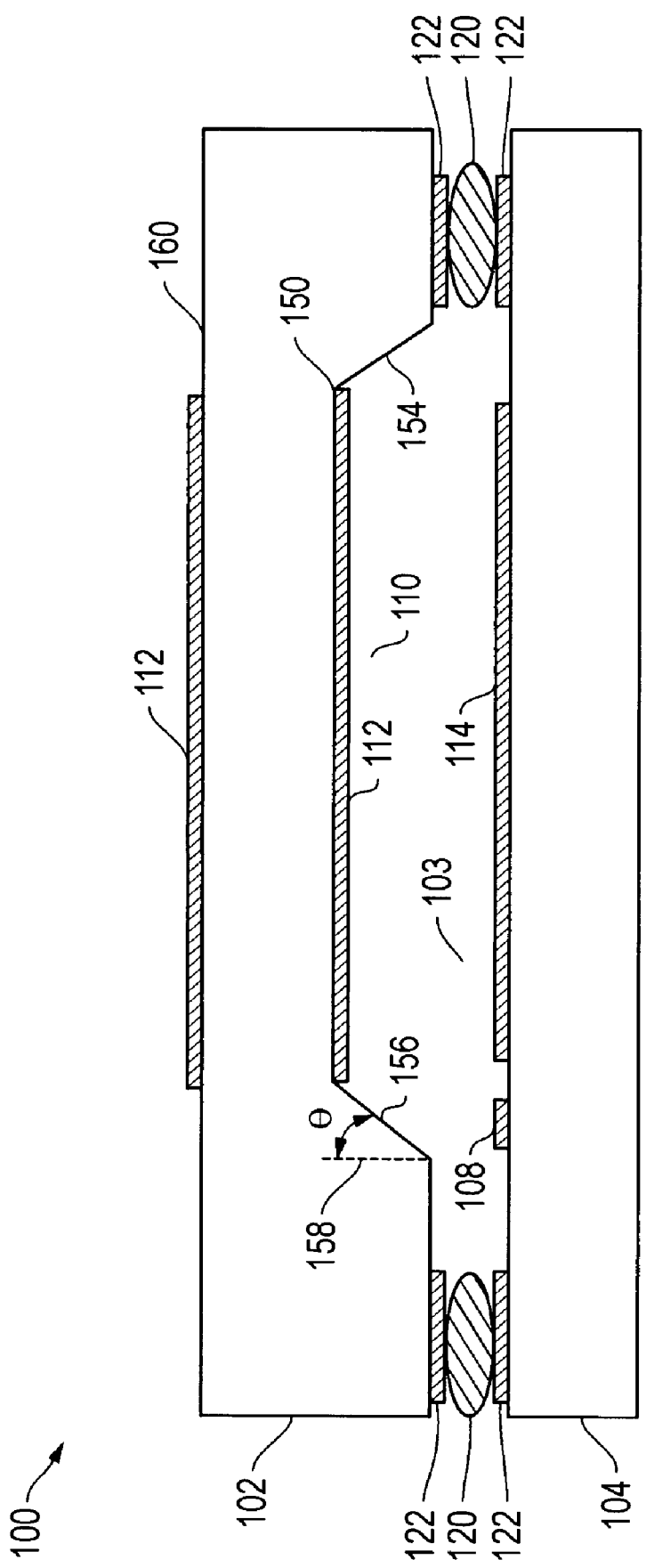
FIG. 3B is a simplified side cross-sectional view of a vacuum packaged focal plane array (FPA) assembly according to one embodiment of the disclosed systems and methods.

FIG. 3B illustrates a cross sectional view of another exemplary embodiment of a vacuum packaged uncooled M×N focal plane array (FPA) assembly 100 in a solder-sealed wafer-level vacuum packaged configuration including transparent lid wafer element 102 and FPA/ROIC device wafer die element 104. Like the exemplary embodiment of FIG. 3A, lid wafer element 102 of assembly 100 includes a cavity 110 and antireflection surfaces 112 provided on inner and outer surfaces 150 and 160 over the active infrared detector pixels of focal plane array 114. However, in this embodiment a wall of cavity 110 is configured as an optically blocking structure that is provided over reference pixel array 108, i.e., in the form of optically blocking angled inner surface 156 of lid wafer element 102 as shown. In such an embodiment, angled inner surface 156 may be configured to have an angle θ that is greater than or equal to the critical angle (e.g., arcsin (1/3.42)=17 degrees for silicon with refraction index 3.42 in the long wavelength infrared band) relative to the direction 158 of incident light (e.g., infrared light) transmitted by lid wafer element 102, i.e., the smallest angle of incidence for which light is totally reflected. In this configuration, angled inner surface 156 substantially optically blocks reference pixel array 108 by shielding reference pixel array 108 from incident infrared light and thus at least partially or completely blocks transmission of infrared radiation to reference pixel array 108. Such an embodiment allows reference pixel array 108 to be placed relatively close to active pixel array 114, allowing the overall size or footprint of assembly 100 to be reduced. It will be understood that the critical angle may vary according to the composition of lid wafer element 102.

Figure 4:
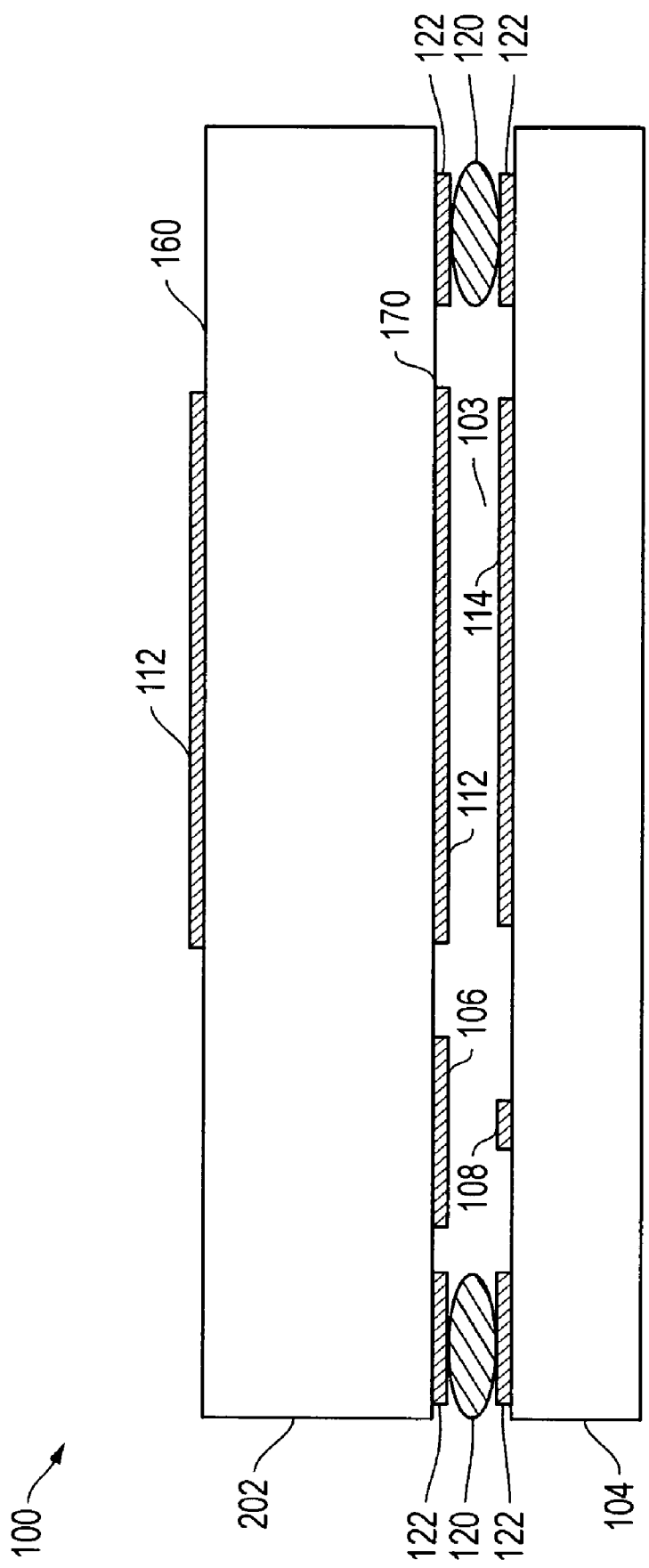
FIG. 4 is a simplified side cross-sectional view of a vacuum packaged focal plane array (FPA) assembly according to one embodiment of the disclosed systems and methods.

FIG. 4 illustrates a cross sectional view of another exemplary embodiment of a vacuum packaged uncooled M×N focal plane array assembly 100 in a solder-sealed wafer-level vacuum packaged configuration including infrared transparent cavity-less lid wafer element 202 and FPA/ROIC device wafer die element 104. In this alternative embodiment, lid wafer element 202 is configured with an inner surface 170 that extends in a substantially planar manner across assembly 100 in close proximity to reference pixel array 108 and active pixel array 114, i.e., without any cavity or recess formed in lid wafer element 202 above reference pixel array 108 or active pixel array 114. As illustrated, antireflection surfaces 112 are placed on outer surface 160 and inner surface 170 of lid wafer element 202 over the active infrared detector pixels of focal plane array 114, and optically blocking layer 106 is provided on the inner surface 170 of the lid wafer element 202 directly over the reference pixel array 108. Since no space is allocated for a angled inner surface of lid wafer element 202, such an embodiment allows reference pixel array 108 to be placed relatively closer to active pixel array 114 if desired, allowing the overall size or footprint of assembly 100 to be reduced. Furthermore, overall height of the assembly may be reduced since no space is allocated for a cavity within lid wafer element 202.

Figure 5:
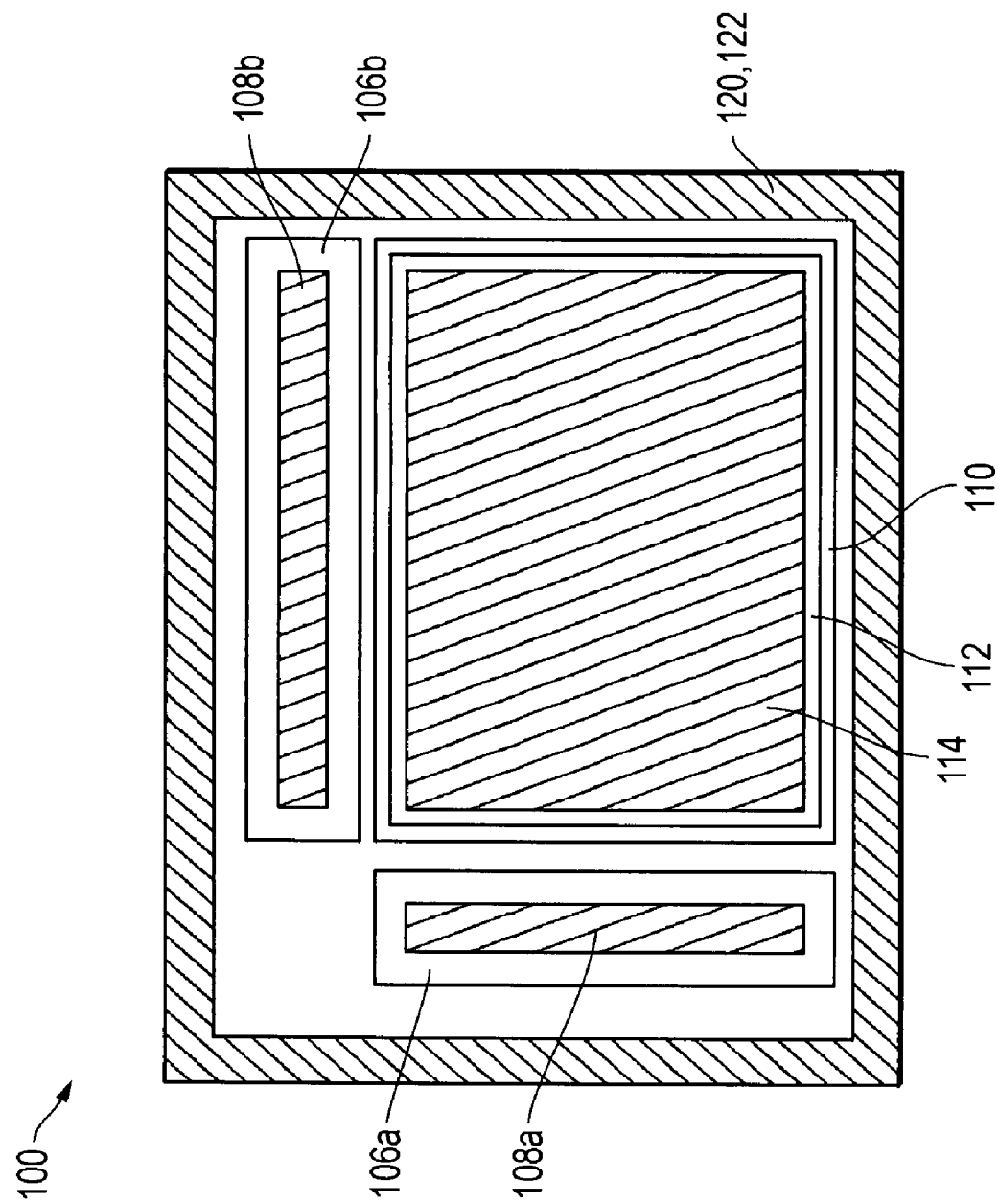
FIG. 5 is a simplified overhead cross-sectional view of the vacuum packaged vacuum packaged focal plane array (FPA) assembly of FIG. 3A.

FIG. 5 is an overhead cross-sectional view of the vacuum packaged uncooled M×N focal plane array assembly 100 of FIG. 3A, showing the optically blocked P×Q reference pixels of reference pixel arrays 108 in wafer level vacuum packageable layout. In the illustrated embodiment, multiple reference pixel arrays 108a (i.e., column array) and 108b (i.e., row array) are shown provided on FPA/ROIC wafer 104 shown in FIG. 4. Also shown in FIG. 5 are optically blocking layers 106a and 106b provided on the inner surface of the lid wafer element 102 and positioned directly over suspended thermally isolated reference pixel elements of column array 108a and row array 108b, respectively. Also visible are active pixel array 114 of suspended thermally isolated infrared detector elements on FPA/ROIC wafer 104, antireflection surfaces 112, lid cavity 110, solder seal 120, and metallization layers 122 provided on lid wafer element 102 and FPA/ROIC wafer 104.

It will be understood with benefit of this disclosure that the disclosed systems and methods may be implemented with a variety of different focal plane array assembly configurations. For example, in one alternative embodiment, a focal plane array package assembly may be provided that includes a package assembly lid having one or more openings defined therein that are configured to overly active detector pixels of an active pixel focal plane array of the package assembly, and having an optically blocking structure configured to at least partially optically block reference pixels of a reference array of the package assembly. In such an embodiment, the package assembly lid has one or more openings therein and does not perform the function of a vacuum package lid.

Although particular exemplary embodiments of optically blocked reference pixels and reference pixel arrays have been illustrated herein, it will be understood that a variety of other configurations are, possible, for example, only one reference pixel array or more than two reference pixel arrays may be present. It will also be understood that reference pixels may be of provided in any other suitable pattern or geometry (e.g., circular, irregular, square, etc.) that is at least partially shielded from infrared or other type light or radiation using one or more optical blocking configurations described elsewhere herein. For example, reference pixels may be configured in the form of a partial column or row array, configured as a single reference pixel rather than as a reference pixel array, provided as combinations thereof, etc.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed methods and systems may be utilized in various combinations and/or independently. Thus the invention is not limited to only those combinations shown herein, but rather may include other combinations.

What is claimed is:

1. A focal plane array package assembly, comprising:
   at least one active detector pixel element;
   at least one reference pixel element;
   an optically blocking structure disposed in spaced relationship with said at least one reference pixel element to at least partially optically block said reference pixel element; and
   a package assembly lid overlying said at least one active detector pixel element and said at least one reference pixel element; said package assembly lid comprising said optically blocking structure;
   wherein said package assembly lid has a raised inner surface and a stepped down inner surface;
   wherein a cavity is defined in said package assembly lid, said cavity being formed by said raised inner surface of said package assembly lid and extending above said at least one active detector pixel element, said raised inner surface being disposed at a first distance from said at least one active detector pixel element;
   wherein said stepped down inner surface of said package assembly lid extends above said at least one reference pixel element, said stepped down inner surface being disposed at a second distance from said at least one reference pixel element, said second distance being less than said first distance; and
   wherein said stepped down inner surface of said package assembly lid supports said optically blocking structure in spaced relationship with said at least one reference pixel element.

2. The focal plane array package assembly of claim 1, wherein said at least one active detector pixel element comprises at least one active infrared detector pixel element; wherein said at least one reference pixel element comprises at least one infrared reference pixel element; and wherein said optically blocking structure is disposed in spaced relationship with said at least one infrared reference pixel element to at least partially optically block infrared radiation from reaching said infrared reference pixel element.

3. The focal plane array package assembly of claim 2, wherein said stepped down inner surface of said package assembly lid extends above said at least one infrared reference pixel element to support said optically blocking structure at a distance of from about 10 to about 25 microns from said at least one infrared reference pixel element.

4. The focal plane array package assembly of claim 3, wherein said raised inner surface extends above said at least one active infrared detector pixel element at a distance of from about 100 microns to about 800 microns from said at least one active infrared detector pixel element.

5. The focal plane array package assembly of claim 2, wherein said focal plane array package comprises a vacuum package assembly; and wherein said package assembly lid comprises a vacuum package lid.

6. The focal plane array package assembly of claim 3, wherein said optically blocking structure comprises an optically blocking surface.

7. The focal plane array package assembly of claim 2, said focal plane array package assembly comprising at least one array of active infrared detector pixel elements; and at least one array of infrared reference pixel elements; wherein said at least one array of infrared reference pixel elements is optically blocked by said optically blocking structure.

8. The focal plane array package assembly of claim 2, wherein said at least one active infrared detector pixel element has thermal isolation legs; wherein said at least one infrared reference pixel element has thermal isolation legs; and wherein a length of said thermal isolation legs of said at least one infrared reference pixel element is substantially the same as the length of said thermal isolation legs of said at least one active infrared detector pixel element.

9. The focal plane array package assembly of claim 2, wherein each of said at least one active infrared detector pixel element and said at least one infrared reference pixel element comprises a microbolometer detector pixel element.

10. A focal plane array assembly, comprising:
a device wafer die element, said device wafer die element comprising at least one active detector pixel element array and at least one reference pixel element array disposed on a first surface thereof; and
a lid wafer element, said lid wafer element having a first surface disposed in relationship to said first surface of said device wafer die element such that said first surface of said lid wafer element overlies said at least one active detector pixel element array and said at least one reference pixel element array;
wherein said lid wafer element is configured to at least partially optically block said at least one reference pixel element array;
wherein said first surface of said lid wafer element comprises a raised inner surface portion and a stepped down inner surface portion;
wherein a cavity is defined in said lid wafer element, said cavity being formed by said raised inner surface portion of said lid wafer element and extending above said at least one active detector pixel element array, said raised inner surface being disposed at a first distance from said at least one active detector pixel element array; and
wherein said stepped down inner surface portion of said lid wafer element extends above said at least one reference pixel element array, said stepped down inner surface being disposed at a second distance from said at least one reference pixel element array, said second distance being less than said first distance.

11. The focal plane array assembly of claim 10, wherein said at least one active detector pixel element array comprises at least one active infrared detector pixel element array; wherein said at least one reference pixel element array comprises at least one infrared reference pixel element array; and wherein said lid wafer element is configured to at least partially optically block infrared radiation from reaching said at least one infrared reference pixel element array.

12. The focal plane array package assembly of claim 11, wherein said stepped down inner surface portion of said lid wafer element extends above said at least one infrared reference pixel element array at a distance of from about 10 to about 25 microns from said at least one infrared reference pixel element array.

13. The focal plane array package assembly of claim 12, wherein said raised inner surface portion of said lid wafer element extends above said at least one active infrared detector pixel element array at a distance of from about 100 microns to about 800 microns from said at least one active infrared detector pixel element array.

14. The focal plane array assembly of claim 11, wherein said stepped down inner surface portion of said lid wafer element is configured with an optically blocking structure to optically block said at least one infrared reference pixel element array.

15. The focal plane array assembly of claim 14, wherein said optically blocking structure comprises an optically blocking surface disposed on said stepped down inner surface portion of said lid wafer element.

16. The focal plane array assembly of claim 15, wherein said optically blocking surface comprises a reflective layer.

17. The focal plane array assembly of claim 11, wherein each pixel element of said at least one active infrared detector pixel element array has thermal isolation legs; wherein each pixel element of said at least one infrared reference pixel array has thermal isolation legs; and wherein a length of said thermal isolation legs of each pixel element of said infrared reference pixel array is substantially the same as the length of said thermal isolation legs of said pixel element of said active infrared detector pixel array.

18. The focal plane array assembly of claim 11, wherein said lid wafer element is configured to be non-optically transmissive over said infrared reference pixel element array so as to completely block infrared radiation from reaching said at least one infrared reference pixel element array.

19. The focal plane array assembly of claim 11, wherein each of said at least one active infrared detector pixel element array and said at least one infrared reference pixel element array comprises microbolometer detector pixel elements.

20. A method of making a focal plane array assembly, comprising:
providing at least one active detector pixel and at least one reference pixel on a first surface of a device wafer; and
providing and disposing a lid wafer in relationship to said device wafer, said lid wafer comprising an optically blocking structure disposed in a spaced relationship to said at least one reference pixel of said device wafer to at least partially block said at least one reference pixel;
wherein said lid wafer has a raised inner surface portion and a stepped down inner surface portion;
wherein a cavity is defined in said lid wafer, said cavity being formed by said raised inner surface portion of said lid wafer and extending above said at least one active detector pixel element, said raised inner surface being disposed at a first distance from said at least one active detector pixel and said stepped down inner surface being disposed at a second distance from said at least one reference pixel, said second distance being less than said first distance.

21. The method of claim 20, wherein said at least one active detector pixel comprises at least one active infrared detector pixel; wherein said at least one reference pixel comprises at least one infrared reference pixel; and wherein said lid wafer comprises an optically blocking structure disposed in a spaced relationship to said at least one infrared reference pixel of said device wafer to at least partially block infrared radiation from reaching said at least one infrared reference pixel.

22. The method of claim 21, wherein said method further comprises:
forming at least one active infrared detector pixel array and at least one infrared reference pixel array on said first surface of said device wafer; and
disposing a first surface of said lid wafer in relationship to said first surface of said device wafer such that said first surface of said lid wafer overlies said at least one active infrared detector pixel array and said at least one infrared reference pixel array, said first surface of said lid wafer element comprising said raised inner surface portion and said stepped down inner surface portion of said lid wafer element;

wherein said lid wafer is disposed in relationship to said first surface of said device wafer so that said optically blocking structure is in a position to optically block said at least one infrared reference pixel array;

wherein said stepped down inner surface portion of said lid wafer extends above said at least one infrared reference pixel element such that said cavity does not extend over said at least one infrared reference pixel element; and wherein said stepped down inner surface portion of said lid wafer supports said optically blocking structure in spaced relationship with said at least one infrared reference pixel element.

23. The method of claim 22, wherein said stepped down inner surface portion of said lid wafer element extends above said at least one infrared reference pixel element array at a distance of from about 10 to about 25 microns from said at least one infrared reference pixel element array.

24. The method of claim 23, wherein said raised inner surface portion of said lid wafer element extends above said at least one active infrared detector pixel element array at a distance of from about 100 microns to about 800 microns from said at least one active infrared detector pixel element array.

25. The method of claim 22, further comprising forming said optically blocking structure on said stepped down inner surface portion of said lid wafer, said optically blocking structure comprising an optically blocking surface.

26. The method of claim 25, wherein said optically blocking surface comprises a reflective layer.

27. The method of claim 22, further comprising bonding said lid wafer to said device wafer to form a bonded wafer pair; and then segmenting said bonded wafer pair to form a single die assembly comprising at least one active infrared detector pixel array and at least one infrared reference pixel array with an optically blocking structure in a position to optically block said at least one infrared reference pixel array of said single die assembly.

28. The method of claim 21, wherein said at least one active infrared detector pixel has thermal isolation legs; wherein said at least one infrared reference pixel has thermal isolation legs; and wherein a length of said thermal isolation legs of said at least one infrared reference pixel is substantially the same as the length of said thermal isolation legs of said at least one active infrared detector pixel.

29. The method of claim 21, wherein said optically blocking structure is non-optically transmissive.

30. The method of claim 21, wherein each of said at least one active infrared detector pixel and said at least one infrared reference pixel comprises a microbolometer detector pixel.

31. A focal plane array package assembly, comprising:

at least one active detector pixel element;

at least one reference pixel element;

an optically blocking structure disposed in spaced relationship with said at least one reference pixel element to at least partially optically block said reference pixel; and a package assembly lid overlying said at least one active detector pixel element and said at least one reference pixel element; said package assembly lid comprising said optically blocking structure;

wherein said at least one active detector pixel element has thermal isolation legs; wherein said at least one reference pixel element has thermal isolation legs; and wherein a length of said thermal isolation legs of said at least one reference pixel element is substantially the same as the length of said thermal isolation legs of said at least one active detector pixel element; and wherein difference in Joule heating between said at least one active detector pixel element and said at least one reference pixel element is substantially eliminated.

32. The focal plane array package assembly of claim 31, wherein said at least one active detector pixel element comprises at least one active infrared detector pixel element; wherein said at least one reference pixel element comprises at least one infrared reference pixel element; and wherein said optically blocking structure is disposed in spaced relationship with said at least one infrared reference pixel element to at least partially optically block infrared radiation from reaching said infrared reference pixel element.

* * * * *